United States Patent
Goller et al.

(10) Patent No.: US 6,683,374 B2
(45) Date of Patent: Jan. 27, 2004

(54) ELECTRONIC COMPONENT AND PROCESS FOR PRODUCING THE ELECTRONIC COMPONENT

(75) Inventors: Bernd Goller, Kemnath (DE); Robert-Christian Hagen, Sarching (DE); Gerald Ofner, Bad Abbach (DE); Christian Stümpfl, Schwandorf (DE); Josef Thumbs, Breitenbrunn (DE); Stefan Wein, Regensburg (DE); Holger Wörner, Regensburg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/232,172

(22) Filed: Aug. 30, 2002

(65) Prior Publication Data

US 2003/0042590 A1 Mar. 6, 2003

(30) Foreign Application Priority Data

Aug. 30, 2001 (DE) .......................... 101 42 119

(51) Int. Cl.[7] .............................................. H01L 23/02
(52) U.S. Cl. ...................................... 257/686; 287/777
(58) Field of Search ................................ 257/686, 685, 257/777, 784

(56) References Cited

U.S. PATENT DOCUMENTS 5,923,090 A * 7/1999 Fallon et al.
5,949,135 A * 9/1999 Washida et al.
6,057,598 A * 5/2000 Payne et al.
6,448,636 B2 * 9/2002 Suenaga et al.
6,462,420 B2 * 10/2002 Hikita et al.
6,507,115 B1 * 1/2003 Hofstee et al.
6,555,917 B1 * 4/2003 Heo et al.

FOREIGN PATENT DOCUMENTS

| JP | 3-69150 A | 3/1991 |
| JP | 04 102 366 A | 4/1992 |
| JP | 04 196 263 A | 7/1992 |
| JP | 04 274 356 A | 9/1992 |
| JP | 08 250 651 A | 9/1996 |
| JP | 10 335 577 A | 12/1998 |
| JP | 2000 101 016 A | 4/2000 |

* cited by examiner

*Primary Examiner*—Sheila V. Clark
(74) *Attorney, Agent, or Firm*—Laurence A. Greenberg; Werner H. Stemer; Ralph E. Locher

(57) ABSTRACT

An electronic component has at least a first semiconductor chip module, a second semiconductor chip module, and a substrate to accommodate the semiconductor chip modules. In this case, active chip surfaces of the two semiconductor chip modules each have a central contact area, which are disposed to face each other. The individual solder contact areas formed on the central contact areas and corresponding with one another are opposite and aligned with one another and are electrically conductively connected.

15 Claims, 2 Drawing Sheets

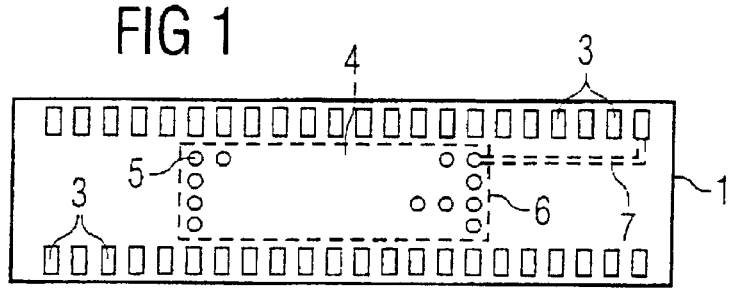
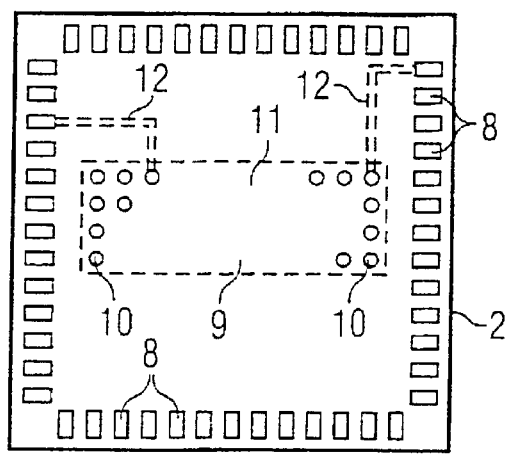
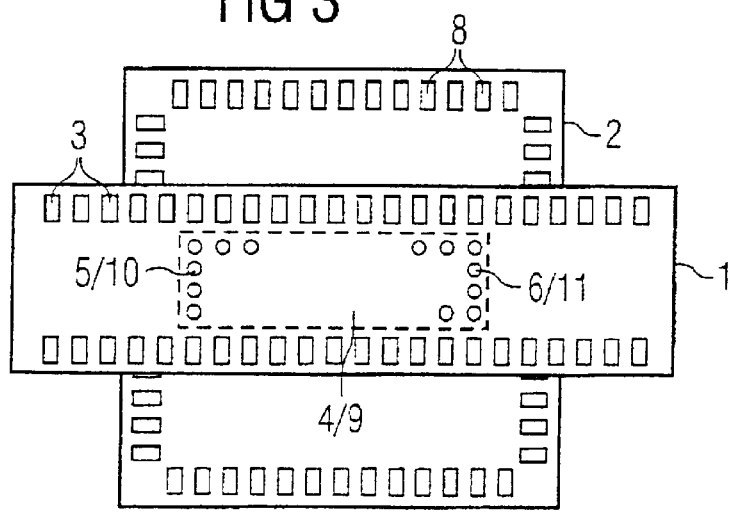

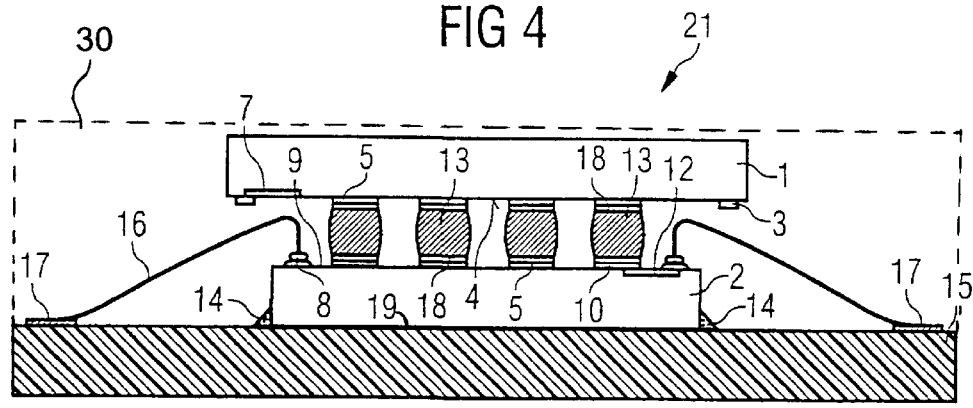
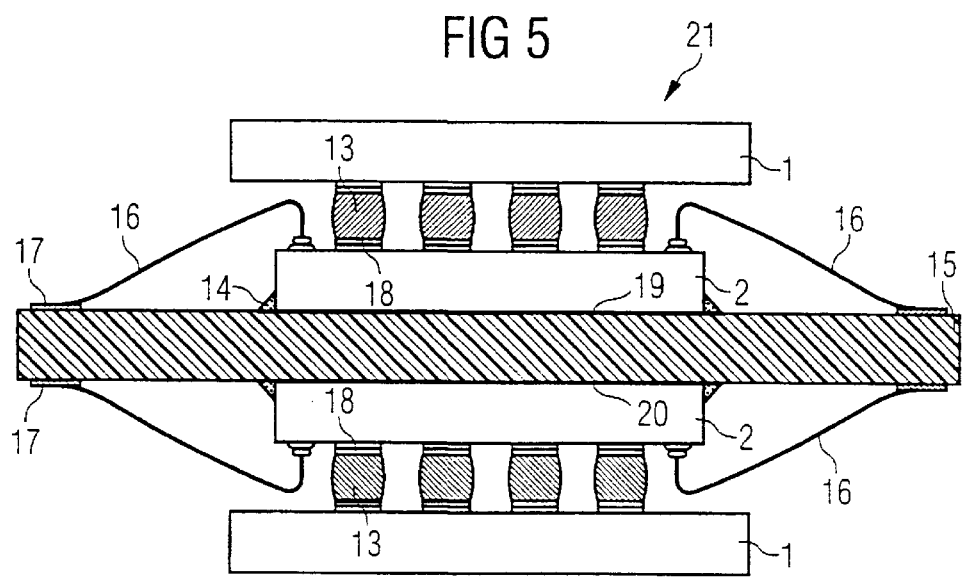

ELECTRONIC COMPONENT AND PROCESS FOR PRODUCING THE ELECTRONIC COMPONENT

BACKGROUND OF THE INVENTION

Field of the Invention

The invention relates to an electronic component and a process for its production.

In many electronic components, a first semiconductor chip module, for example a logic module, and a second semiconductor module, for example a memory module, are needed. In order to save space on a printed circuit board, it is expedient to accommodate both semiconductor chip modules in a common housing with the smallest possible space requirement. Now, a logic module typically has a square base area and a memory module has a rectangular base area, so that when semiconductor chip modules are disposed one above another, as in the case of a known chip-on-chip construction, the bonding contact areas to some extent cover one another. Hitherto, the problem has been solved by the two semiconductor chip modules having been disposed beside each other in a common housing, which gave rise to a considerable space requirement. In an alternative solution, the two semiconductor chip modules were mounted in a lead-frame housing, which entails cumbersome and difficult mounting, since the components have to be turned many times and, in the process, the bonding wires to some extent are exposed. A further principle has also been used, in which the semiconductor chip modules are mounted in different housings that are then disposed above another. However, this is also a complicated and costly process that, in addition, leads to larger and higher installation heights of the electronic component of this type.

Published, Japanese Patent Application JP 08250651-A discloses a semiconductor configuration in which two semiconductor chip modules are disposed one above the other in spaces separated by an intermediate wall. The two semiconductor chip modules are connected to outer contacts via conductor tracks by bonding wires. The known semiconductor configuration takes up a great deal of space and is cumbersome and complicated to produce.

SUMMARY OF THE INVENTION

It is accordingly an object of the invention to provide a electronic component and a process for producing the electronic component which overcomes the above-mentioned disadvantages of the prior art devices and methods of this general type, which is constructed simply and can be produced economically and which takes up little space.

With the foregoing and other objects in view there is provided, in accordance with the invention, an electronic component. The electronic component contains a substrate having substrate contact areas and semiconductor chip modules including a first semiconductor chip module and a second semiconductor chip module supported by the substrate. The semiconductor chip modules each have an active chip surface and contact areas disposed on the active chip surface. The active chip surface of the first and second semiconductor chip modules each have a central contact area disposed facing each other. The central contact area of the first and second chip modules have solder contact areas corresponding with one another and disposed opposite and aligned with one another and electrically conductively connected to each other. Bonding wires connect the contact areas of the active chip surface of each of the semiconductor chip modules to the substrate contact areas.

According to the invention, the electronic component has at least the first semiconductor chip module, the second semiconductor chip module, and the substrate to accommodate the semiconductor chip modules.

Bonding wires are provided, which are connected to the contact areas of the active chip surfaces of each semiconductor chip module and the contact connecting areas of the substrate. In this case, the active chip surfaces of the first and second semiconductor chip module each have a central contact area. The central contact areas are disposed to face each other, and individual solder contact areas formed on the central contact areas of the two semiconductor chip modules correspond with one another and are aligned with one another and are electrically conductively connected.

The electronic component according to the invention has the advantage that, as a result of the mutually facing central contact areas of the two semiconductor chip modules with their solder contact areas disposed to correspond to one another, semiconductor chip modules with different external dimensions can be accommodated in an extremely space-saving manner in a common housing. It is therefore possible to stack a rectangular semiconductor chip with a square semiconductor chip and vice-versa, the semiconductor chips overlapping only partly and both semiconductor chips in each case having regions that project beyond the overlap. For different external dimensions of this type, the prior art does not provide any usable solution. In addition, in one embodiment of the invention, the outer contact areas of the two semiconductor chip modules are electrically conductively connected to the corresponding solder contact areas by conductor tracks, by which thermal stresses during the mounting of the electronic component according to the invention on a printed circuit board or on a common substrate are reduced.

In an embodiment of the invention, the solder contact areas formed on the central contact areas of the first and second semiconductor chip modules that correspond with one another are disposed in a mirror-image fashion in relation to one another.

The embodiment has the advantage that, by the simple procedure of laying one semiconductor chip module on the other, it is possible to make contact quickly and reliably between the first and second semiconductor modules.

A further embodiment provides for contact bumps to be provided between the opposite solder contact areas of the mutually facing central contact areas of the first and second semiconductor chip modules. In the embodiment, it is advantageous that making contact between one semiconductor chip module and the other semiconductor chip module can be carried out effectively and economically by a single heating operation. In this case, the contact bumps can be connected electrically to the solder contact areas of the first and second semiconductor chip modules, for example by eutectic soldering.

In a further embodiment of the invention, provision is made for one contact bump to be formed as a pillar bump and for its height to be greater than the radius of its base area. On the basis of the configuration of the contact bumps, accurate and efficient making of contact between the first and the second semiconductor chip modules is possible, the electrical connection of the two semiconductor chip modules being carried out by a flip-chip technique.

The advantage of an electronic component constructed and produced in accordance with the invention is that a logic module having a rectangular form and a memory module having a square form can be reliably connected electrically to one another in a small space. A significant advantage arises from the fact that the bonding wires for electrical connection are provided only between the second semiconductor chip module and the substrate.

A process for the production of an electronic component contains is now described. A first semiconductor chip module with a central contact area is provided. A second semiconductor chip module with a central contact area and a substrate with a chip island and outer contact areas are provided. The second semiconductor chip module is fixed on the chip island of the substrate by a conductive adhesive layer or solder layer. Bonding wires are connected between the contact areas of the second semiconductor chip module and the outer contact areas of the substrate. The first semiconductor is fitted with contact bumps. The first semiconductor chip module is applied to the second semiconductor chip module seated on the substrate by a flip-chip technique. The electronic component (i.e. the semiconductor chip modules and the substrate) is potted in a housing.

The process for the production of an electronic component has the advantage that it has very short production times since the use of the flip-chip technique results in that making electrical contact between the first and the second semiconductor chip module can be carried out in a time-saving manner by the respective central contact areas disposed in mirror-image fashion on the two opposite semiconductor chip modules.

In addition, the product of the process, the electronic component, has a very compact configuration.

In an exemplary implementation of the process, sets of the first semiconductor chip module and the second semiconductor chip module are disposed on the chip island of the upper side of the substrate and on the opposite chip island of the underside of the substrate.

The advantage of the exemplary implementation is a further increase in the performance of such electronic components, with a considerably reduced requirement for space.

The invention permits the implementation of very compact electronic components, in that all the electrical connections of the two semiconductor chip modules are in each case disposed as solder contact points in a central contact area in such a way that they are initially located in mirror-image fashion in relation to one another and, when the first semiconductor chip module is placed inverted on the second semiconductor chip module by the flip-chip technique, the mutually associated contact points are aligned with one another. Electrical contact is made by contact bumps, which are formed as pillar bumps and, as high melting-point solder connections, connect the contact areas of the semiconductor chips lying one above another electrically to one another. In addition, it is ensured that the bonding wires running between the substrate and the semiconductor chip module connected thereto are not touched by the semiconductor chip module located above.

The advantages of the invention reside in the fact that no rewiring on the substrate is required, and in that optimum performance between the first and second semiconductor chip modules is achieved as a result of the short signal paths. In spite of the unfavorable geometric dimensions of the two semiconductor chip modules, an electronic component that has a small structure and can be produced economically is provided by the combination of the wire-bonding technique with the flip-chip technique, using pillar bumps as spacers.

Other features which are considered as characteristic for the invention are set forth in the appended claims.

Although the invention is illustrated and described herein as embodied in a electronic component and a process for producing the electronic component, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWINGS

FIG. 1 is a diagrammatic, plan view of a first semiconductor chip module according to the invention;

FIG. 2 is a diagrammatic, plan view of a second semiconductor chip module;

FIG. 3 is a diagrammatic, plan view of two semiconductor chip modules disposed one above the other and having different geometric dimensions;

FIG. 4 is a diagrammatic, cross-sectional view of an electronic module; and

FIG. 5 is a diagrammatic, cross-sectional view of a further exemplary embodiment of the electronic component.

DESCRIPTION OF THE PREFERRED EMBODIMENTS

Referring now to the figures of the drawing in detail and first, particularly, to FIG. 1 thereof, there is shown a first semiconductor chip module 1, for example a logic module, belonging to an electronic component 21 and having a rectangular geometric form. On its two long sides, the semiconductor chip module 1 is provided with a number of first outer contact areas 3. Furthermore, the semiconductor chip module 1 has a first central contact area 4, on which a number of first solder contact areas 5 corresponding to the number of first outer contact areas 3 are formed. The first solder contact areas 5 are bounded by a first solder stop layer 6. Each of the outer contact areas 3 is assigned one of the first solder contact areas 5 provided in the first central contact area 4, and the corresponding first outer contact areas 3 and the first solder contact areas 5 are connected electrically to one another by first conductor tracks 7.

FIG. 2 illustrates a second semiconductor chip module 2, for example a memory module, belonging to the electronic component 21 and having a square geometric form. At its four side edges, the second semiconductor chip module 2 is provided with a number of second outer contact areas 8. Furthermore, the second semiconductor chip module 2 has a second central contact area 9, on which a number of second solder contact areas 10 corresponding to the number of second outer contact areas 8 are formed.

The second solder contact areas 10 are bounded by a solder stop layer 11. Each of the outer contact areas 8 is assigned one of the second solder contact areas 10 provided in the central contact area 9, and the corresponding second outer contact areas 8 and the second solder contact areas 10 are connected electrically to one another by second conductor tracks 12.

The number of first solder contact areas 5 of the first semiconductor chip module 1 and the number of second solder contact areas 10 of the second semiconductor chip module 2 are equal. Their geometric configuration is such that, in the non-assembled state of the two semiconductor chip modules 1 and 2, they lie opposite one another in mirror-image fashion.

FIG. 3 illustrates an assembled configuration of the first semiconductor chip module 1 and the second semiconductor module 2 of the electronic component 21 according to the invention. In this case, the first semiconductor chip module 1 has been placed on the second semiconductor chip module 2 by a flip-chip technique after being turned through 180 degrees of arc, in such a way that the functionally corresponding first solder contact areas 5 of the first semiconductor chip module 1 and the second solder contact areas 10 of the second semiconductor chip module 2 are aligned precisely with one another and exact electrical contact connections result.

To make electrical contact between the first solder contact areas 5 and the second solder contact areas 10, contact bumps 13 in the form of pillar bumps are provided, as described further below.

An exemplary embodiment of the electronic component 21 according to the invention is illustrated in a schematic sectional view in FIG. 4.

FIG. 4 shows the first semiconductor chip module 1, for example a logic module, the second semiconductor chip module 2, for example a memory module, the first outer contact areas 3 on the active surface of the first semiconductor chip module 1, the first central contact area 4 on the first semiconductor chip module 1 with the first solder contact areas 5, the first conductor tracks 7 which connect the first outer contact areas 3 electrically to the first solder contact areas 5. The second semiconductor chip module 2, for example a memory module, is electrically conductively fitted by a conductive adhesive layer 14 to a first chip island 19 of a substrate 15. The second semiconductor chip module 2 has the second central contact area 9, on which the second solder contact areas 10 are provided. The second outer contact areas 8 provided on the active surface of the second semiconductor chip module 2 are connected electrically to the corresponding second solder contact areas 10 by the second conductor tracks 12. At the same time, bonding wires 16 lead from the second outer contact areas 8 of the second semiconductor chip module 2 to contact connecting areas 17 on the substrate 15.

Electrical contact between the first solder contact areas 5 of the first semiconductor chip module 1 and the second solder contact areas 10 of the second semiconductor chip module 2 is made by the contact bumps 13 which, in the exemplary embodiment, are formed as pillar bumps 13. The contact bumps 13 of pillar-shaped configurations are connected by a solder layer 18 both to the first solder contact areas 5 of the first semiconductor chip module 1 and to the second solder contact areas 10 of the second semiconductor chip module 2. In this case, the height of the contact bumps 13 is such that the bonding wires 16 connected to the outer contact areas 8 of the second semiconductor chip module 2 and the contact connecting areas 17 of the substrate 15 do not touch the first semiconductor chip module 1.

By the configuration according to the invention of the semiconductor chip modules 1, 2, the electronic component 21 has an extremely small configuration which, because of contact being made between the first and second semiconductor chip modules by solder contact areas disposed in central contact areas and electrically connected by contact bumps, has short signal paths, which ensure optimum switching and control performance of the electronic component.

FIG. 5 shows a further possible optimization of the electronic component 21 according to the invention, in which on opposite sides of the substrate 15 in each case an electronic component of identical configuration formed from the first and second semiconductor chip modules is disposed on the first chip island 19 and on the second chip island 20 of the substrate 15.

The process for the production of the electronic component 21 according to the invention having at least the first semiconductor chip module 1, the second semiconductor chip module 2, and the substrate 15 to accommodate the semiconductor chip modules 1 and 2 and the bonding wires 16 which are connected to the contact areas 3, 8 of the active chip surface of a semiconductor chip module and the contact areas 17 of the substrate 15, is carried out by the process steps described below:

a) providing the first semiconductor chip module 1 with the first central contact area 4;
b) providing the second semiconductor chip module 2 with the second central contact area 9;
c) providing the substrate 15 with the second chip island 20 and the contact connecting areas 17;
d) fixing the second semiconductor chip module 2 on the first chip island 19 of the substrate 15 by a conductive adhesive layer 14 or solder layer;
e) bonding the bonding wires 16 between the second outer contact areas 8 of the second semiconductor chip module 2 and the contact connecting areas 17 of the substrate 15;
f) preparing the first semiconductor chip module 1 by fitting the same with contact bumps 13;
g) applying the first semiconductor chip module 1 to the second semiconductor chip module 2 seated on the substrate 15 using a flip-chip technique; and
h) potting the electronic component in a housing 30.

We claim:

1. An electronic component, comprising:
a substrate having substrate contact areas;
semiconductor chip modules including a first semiconductor chip module and a second semiconductor chip module supported by said substrate, said semiconductor chip modules each having an active chip surface and outer contact areas disposed on said active chip surface, said active chip surface of said first and second semiconductor chip modules each having a central contact area disposed facing each other, said central contact area of said first and second chip modules having solder contact areas corresponding with one another and disposed opposite and aligned with one another and electrically conductively connected to each other;
bonding wires connecting said outer contact areas of said active chip surface of one of said semiconductor chip modules to said substrate contact areas; and
conductor tracks each electrically conductively connecting one of said outer contact areas to a corresponding one of said solder contact areas.

2. The electronic component according to claim 1, wherein said solder contact areas of said first and second semiconductor chip modules corresponding with one another are disposed in a mirror-image fashion in relation to one another.

3. The electronic component according to claim 1, further comprising contact bumps disposed between said solder contact areas mutually facing each other of each of said central contact area of said first and second semiconductor chip modules.

4. The electronic component according to claim 3, wherein said contact bumps are connected electrically to said solder contact areas of said first and second semiconductor chip modules using a eutectic soldering process.

5. The electronic component according to claim 3, wherein one of said contact bump is a pillar bump having a base area and a height greater than a radius of said base area.

6. The electronic component according to claim 1, wherein said first semiconductor chip module and said second semiconductor chip module are connected electrically to each other by a flip-chip technique.

7. The electronic component according to claim 1, wherein said first semiconductor chip module has a rectangular form and is a logic module.

8. The electronic component according to claim 1, wherein said second semiconductor chip module has a square form and is a memory module.

9. The electronic component according to claim 1, further comprising a housing accommodating said first and second semiconductor chip modules and said substrate.

10. The electronic component according to claim 1, wherein some of said bonding wires electrically connect said second semiconductor chip module to said substrate.

11. The electronic component according to claim 1, wherein said substrate has an upper side with a first chip island and a bottom side with a second chip island, a first set of said first and second semiconductor chip modules disposed on said first chip island and a second set of said first and second semiconductor chip modules disposed on said second chip island.

12. A process for producing an electronic component, which comprises the steps of:

providing a first semiconductor chip module having outer contact areas and a first central contact area with solder contact areas disposed within the first central contact area;

providing a second semiconductor chip module having outer contact areas and a second central contact area with solder contact areas disposed within the second central contact area;

providing each semiconductor chip module with contact tracks each electrically conductively connecting one of the outer contact areas to a corresponding one of the solder contact areas;

providing a substrate having a chip island and contact connecting areas;

fixing the second semiconductor chip module on the chip island of the substrate using one of a conductive adhesive layer and a solder layer;

connecting bonding wires between contact areas of the second semiconductor chip module and the contact connecting areas of the substrate;

fitting contact bumps on the first semiconductor chip module;

seating the second semiconductor chip on the substrate;

applying the first semiconductor chip module to the second semiconductor chip module seated on the substrate using a flip-chip technique; and potting the semiconductor chip modules and the substrate in a housing.

13. The method according to claim 12, which comprises:

providing the substrate with a second chip island; and disposing a first set of the first semiconductor chip module and the second semiconductor chip module on the first chip island situated on an upper side of the substrate and disposing a second set of the first semiconductor chip module and the second semiconductor chip module on the second chip island situated on an underside of the substrate.

14. An electronic component, comprising:

a substrate having an upper side with a first chip island, a bottom side with a second chip island, and substrate contact areas;

a first set of semiconductor chip modules disposed on said first chip island and a second set of semiconductor chip modules disposed on said second chip island;

each of said semiconductor chip modules including a first semiconductor chip module and a second semiconductor chip module supported by said substrate, said semiconductor chip modules each having an active chip surface and outer contact areas disposed on said active chip surface, said active chip surface of said first and second semiconductor chip modules each having a central contact area disposed facing each other, said central contact area of said first and second chip modules having solder contact areas corresponding with one another and disposed opposite and aligned with one another and electrically conductively connected to each other; and bonding wires connecting said outer contact areas of said active chip surface of one of said semiconductor chip modules to said substrate contact areas.

15. A process for producing an electronic component, which comprises the steps of:

providing a first semiconductor chip module having a first central contact area;

providing a second semiconductor chip module having a second central contact area;

providing a substrate having a first chip island, a second chip island, and contact connecting areas;

fixing the second semiconductor chip module on the first chip island of the substrate using one of a conductive adhesive layer and a solder layer;

connecting bonding wires between contact areas of the second semiconductor chip module and the contact connecting areas of the substrate;

fitting contact bumps on the first semiconductor chip module;

seating the second semiconductor chip on the substrate;

applying the first semiconductor chip module to the second semiconductor chip module seated on the substrate using a flip-chip technique;

disposing a first set of the first semiconductor chip module and the second semiconductor chip module on the first chip island situated on an upper side of the substrate and disposing a second set of the first semiconductor chip module and the second semiconductor chip module on the second chip island situated on an underside of the substrate; and potting the semiconductor chip modules and the substrate in a housing.

* * * * *